US012785667B2

(12) United States Patent
Patil et al.

(10) Patent No.: US 12,785,667 B2
(45) Date of Patent: Nov. 3, 2026

(54) SYSTEM STATE SAVE AND RESTORE MECHANISM USING HOLD LATCH CELL

(71) Applicant: QUALCOMM Incorporated, San Diego, CA (US)

(72) Inventors: Srinivas Patil, Austin, TX (US); Qing Yun Li, San Diego, CA (US); Nir Maor, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 92 days.

(21) Appl. No.: 18/908,656

(22) Filed: Oct. 7, 2024

(65) Prior Publication Data

US 2026/0100697 A1 Apr. 9, 2026

(51) Int. Cl.

| | |
|---|---|
| ***H03K 3/037*** | (2006.01) |
| ***G01R 31/3185*** | (2006.01) |
| ***H03K 17/00*** | (2006.01) |
| ***H03K 19/21*** | (2006.01) |

(52) U.S. Cl.

CPC ..... *H03K 3/037* (2013.01); *G01R 31/318525* (2013.01); *H03K 17/002* (2013.01); *H03K 19/21* (2013.01)

(58) Field of Classification Search

CPC ...... H03K 3/037; H03K 17/002; H03K 19/21; G01R 31/318525

USPC .......................................................... 714/733

See application file for complete search history.

(56) References Cited

U.S. PATENT DOCUMENTS

| | | | | |
|---|---|---|---|---|
| 8,407,540 | B2 * | 3/2013 | Chandra | G01R 31/31726 327/202 |
| 8,996,937 | B2 * | 3/2015 | Jain | G06F 11/0751 714/724 |
| 11,300,614 | B1 | 4/2022 | Cron | |
| 11,411,749 | B2 * | 8/2022 | Schat | H03K 19/003 |
| 2007/0150780 | A1 | 6/2007 | Shimooka | |
| 2010/0174956 | A1 | 7/2010 | Kawasaki et al. | |
| 2024/0418776 | A1 * | 12/2024 | Mohammed | G01R 31/318536 |

OTHER PUBLICATIONS

International Search Report and Written Opinion—PCT/US2025/044916—ISA/EPO—Jan. 7, 2026.

* cited by examiner

*Primary Examiner* — James C Kerveros
(74) *Attorney, Agent, or Firm* — Loza & Loza LLP

(57) ABSTRACT

Aspects of the disclosure are directed to a test mode save and restore operation. In accordance with one aspect, the disclosure includes a hold latch cell configured to execute a save directive for a first operational state of a digital logic system and to execute a restore directive for the first operational state in the digital logic system in an operational mode; a first multiplexer coupled to the hold latch cell, the first multiplexer configured to execute a test sequence on the digital logic system in a test mode; and a logical XOR circuit coupled to the hold latch cell, the logical XOR circuit configured to perform a fault detection on the save directive and the restore directive to generate an error flag signal.

20 Claims, 8 Drawing Sheets

SYSTEM STATE SAVE AND RESTORE MECHANISM USING HOLD LATCH CELL

TECHNICAL FIELD

This disclosure relates generally to the field of automotive electronics systems, and, in particular, to rapid automatic self-testing within an automotive electronics system using a system state save and restore mechanism.

BACKGROUND

Automotive electronics systems may include a plurality of processing engines, processors or processing cores for user applications. The plurality of processing engines may interconnect with input/output interfaces, a hierarchy of memory units and associated interconnection databuses. In addition, the automotive electronics system may include a plurality of sensors which communicate with the plurality of processing engines using a plurality of high-speed interfaces. The automotive electronics system may require a periodic self-test mode which interrupts an operational mode. Thus, there is a motivation to implement a rapid automatic self-test mode using a system state save and restore mechanism to minimize operational mode timeline impacts.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a test mode save and restore operation. Accordingly, the present disclosure discloses an apparatus including: a hold latch cell configured to execute a save directive for a first operational state of a digital logic system and to execute a restore directive for the first operational state in the digital logic system in an operational mode; a first multiplexer coupled to the hold latch cell, the first multiplexer configured to execute a test sequence on the digital logic system in a test mode; and a logical XOR circuit coupled to the hold latch cell, the logical XOR circuit configured to perform a fault detection on the save directive and the restore directive to generate an error flag signal.

In one example, the apparatus further includes a second multiplexer coupled to the first multiplexer, the second multiplexer configured to initialize the digital logic system in the operational mode with the first operational state. In one example, the apparatus further includes a flip flop circuit coupled to the second multiplexer, the flip flop circuit configured to transition from the first operational state to a second operational state using one or more updated inputs in the digital logic system in the operational mode. In one example, the save directive and the restore directive are executed over a multi cycle path (MCP). In one example, the save directive and the restore directive are executed with a clock signal disabled.

Another aspect of the disclosure provides an apparatus including: means for executing a save directive for a first operational state of a digital logic system using a hold latch cell in an operational mode; means for executing a test sequence on the digital logic system in a test mode; means for executing a restore directive for the first operational state in the digital logic system in the operational mode; and means for performing a fault detection on the save directive and the restore directive to generate an error flag signal.

In one example, the apparatus further includes means for initializing the digital logic system in the operational mode with the first operational state; and means for transitioning the digital logic system from the operational mode to the test mode. In one example, the apparatus further includes means for transitioning the digital logic system from the test mode to the operational mode; and means for transitioning from the first operational state to a second operational state using one or more updated inputs in the digital logic system in the operational mode.

Another aspect of the disclosure provides a method including: executing a save directive for a first operational state of a digital logic system using a hold latch cell in an operational mode; executing a test sequence on the digital logic system in a test mode; executing a restore directive for the first operational state in the digital logic system in the operational mode; and performing a fault detection on the save directive and the restore directive to generate an error flag signal.

In one example, the save directive saves the first operational state in a hold latch cell. In one example, the save directive utilizes a save signal to trigger a transition in a state output. In one example, the state output is an output state of the hold latch cell. In one example, the executing the restore directive is performed over a multi cycle path (MCP). In one example, the executing the restore directive is performed with a clock signal disabled. In one example, the executing the save directive is performed over a multi cycle path (MCP). In one example, the executing the save directive is performed with a clock signal disabled.

In one example, the method further includes initializing the digital logic system in the operational mode with the first operational state. In one example, the method further includes transitioning the digital logic system from the operational mode to the test mode. In one example, the method further includes transitioning the digital logic system from the test mode to the operational mode. In one example, the method further includes transitioning from the first operational state to a second operational state using one or more updated inputs in the digital logic system in the operational mode.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 1:
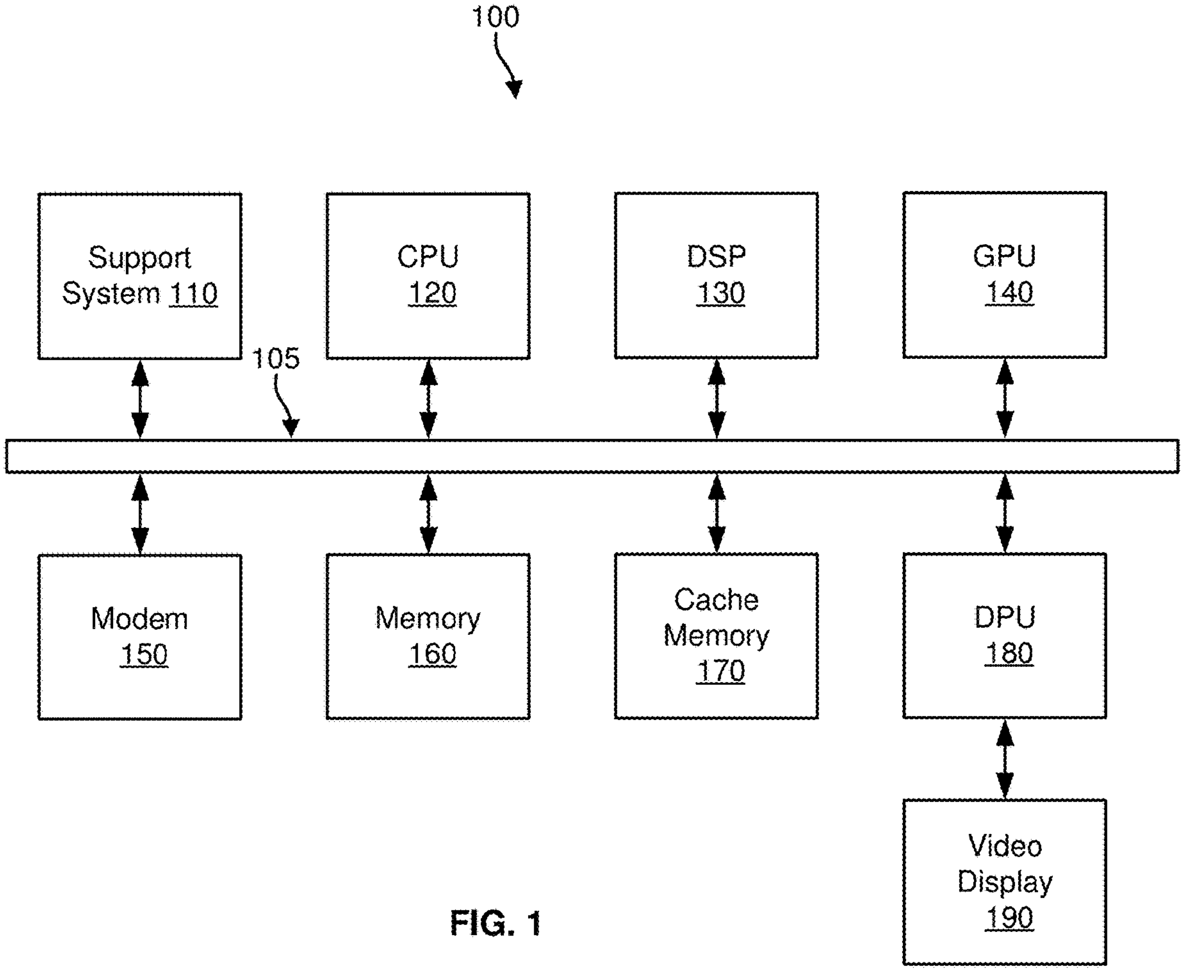
FIG. 1 illustrates an example information processing system for automotive electronics.

FIG. 1 illustrates an example information processing system 100 for automotive electronics. In one example, the information processing system 100 includes a plurality of processing engines such as a central processing unit (CPU) 120, a digital signal processor (DSP) 130, a graphics processing unit (GPU) 140, a display processing unit (DPU) 180, etc. In one example, various other functions in the information processing system 100 may be included such as a support system 110, a modem 150, a memory 160, a cache memory 170 and a video display 190. For example, the plurality of processing engines and various other functions may be interconnected by an interconnection databus 105 to transport data and control information. In one example, the CPU 120 may serve as a controller or a microcontroller of other processing engines. In one example, the controller or microcontroller may reallocate tasks from one processing engine to another.

In one example, the memory 160 and/or the cache memory 170 may be shared among the CPU 120, the GPU 140 and the other processing engines. In one example, the CPU 120 may include a first internal memory which is not shared with the other processing engines. In one example, the GPU 140 may include a second internal memory which is not shared with the other processing engines. In one example, any processing engine of the plurality of processing engines may have an internal memory (i.e., a dedicated memory) which is not shared with the other processing engines. Although several components of the information processing system 100 are included herein, one skilled in the art would understand that the components listed herein are examples and are not exclusive. Thus, other components may be included as part of the information processing system 100 within the spirit and scope of the present disclosure.

In one example, one or more processing engines in the information processing system 100 may be aggregated into a single integrated circuit known as a system on a chip (SOC). In one example, the SOC may include the central processing unit (CPU) 120 and other processing engines such as the DSP 130 or the GPU 140. The SOC may also include the memory 160 and the cache memory 170.

In one example, an automobile includes a system test and diagnostics mechanism, for example, a built-in self test (BIST) mode (i.e., a test mode). One motivation for the system test and diagnostic mechanism is compliance with an international automotive safety standard, ISO 26262 (Road vehicles—Functional safety) which provides guidelines for automotive safety requirements, including diagnostic testing. Typically, the BIST mode is interleaved with an operational mode. Hence, there is motivation to minimize the BIST mode timeline impact on the operational mode.

The system test and diagnostic mechanism maybe in at least two forms: a software test library (STL) or a built-in self test (BIST) mode. For example, the STL includes software code which exercises certain design features to attain high fault coverage. For example, the BIST mode employs on-die digital pattern generators and response compactors/comparators for logic circuits and memory circuits. For example, the BIST mode tests a design using the on-die digital pattern generators and response compactors/comparators. For example, there are two types of BIST: a memory BIST (MBIST) to test a memory circuit and a logic BIST (LBIST) to test a logic circuit. For example, the on-die digital pattern generator is a pseudo-random pattern generator which generates a pseudo-random pattern (i.e., a random-like digital sequence based on a deterministic process).

In one example, there are a plurality of in-system test scenarios. For example, a first test scenario operates for power on (PON) and power off (POF) phases during the BIST mode. For example, a second test scenario operates on demand where selected subsystems may be put in an offline state during a mission mode by software to execute a BIST mode. For example, a third test scenario operates periodically during the mission mode and may be implemented using the STL due to BIST limitations.

In one example, for the STL, software code may be run in a mission mode frequency. For example, the software code may execute with minimal test time and minimal disruption to mission mode operations. In one example, the STL may have limited fault coverage and may have limited automation to improve fault coverage.

In one example, for the BIST mode, predictable and pervasive fault coverage may be available. For example, the BIST mode may corrupt a system state which may cause a processor reset and result in a delayed recovery. Thus, for example, an augmented BIST mode which provides a more robust capability is desirable. In one example, the BIST mode may save and restore a system state from special scan cells (i.e., hold latch cells) which maintain the system state during shift operations.

Figure 2:
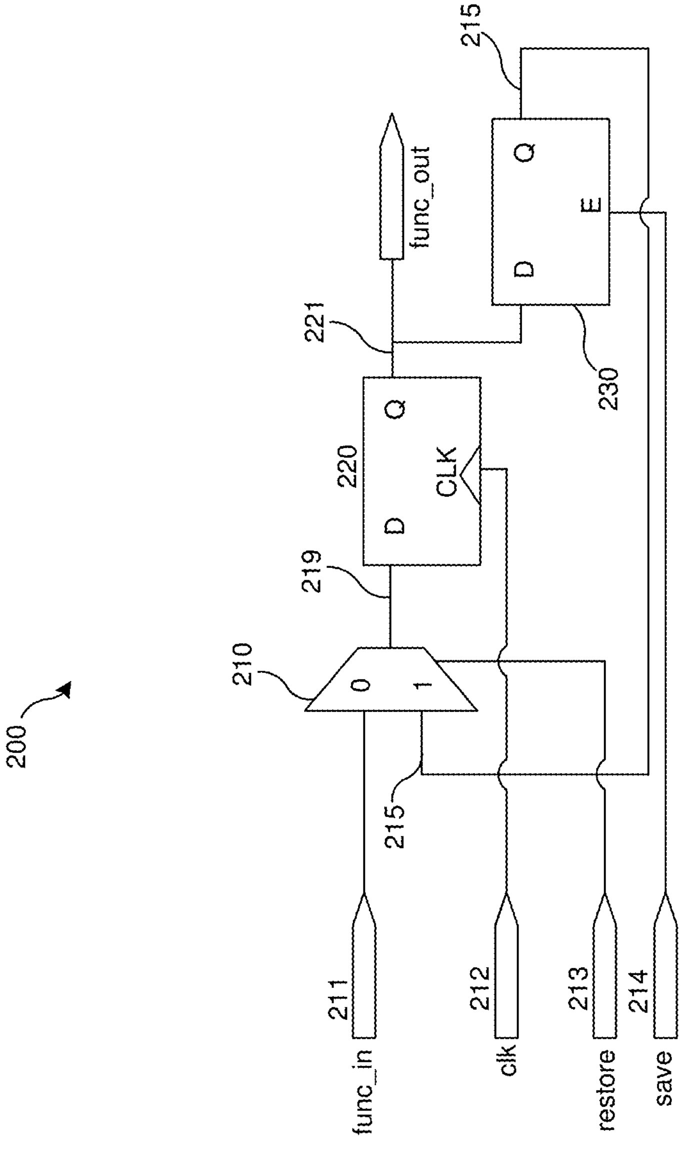
FIG. 2 illustrates an example non-scan cell with hold latch.

FIG. 2 illustrates an example non-scan cell with hold latch 200. In one example, the non-scan cell with hold latch 200 includes a multiplexer 210, a first D flip flop 220 and a second D flip flop 230. In one example, the multiplexer 210 has a first input 211 connected to a function input signal and a second input 215 connected to a state (Q) output signal of the second D flip flop 230. In one example, the multiplexer 210 has a multiplexer output 219 which is determined by a restore signal 213. For example, if the restore signal 213 is at a LOW state, select the first input 211 for the multiplexer output 219. For example, if the restore signal 213 is at a HIGH state, select the second input 215 for the multiplexer output 219.

In one example, the first D flip flop 220 receives the multiplexer output 219 as its D input. In one example, the first D flip flop 220 is triggered by a clock signal 212 at its CLK input. In one example, the first D flip flop 220 produces a first flip flop output 221 as a function output signal.

In one example, the second D flip flop 230 receives the first flip flop output 221 as its D input. In one example, the second D flip flop 230 is triggered by an enable signal 214 which is a save signal. In one example, the second D flip flop 230 produces a second flip flop output 215 which is the state (Q) output signal of the second D flip flop 230. In one example, a first state of the first D flip flop 220 is transferred to a second state of the second D flip flop 230 upon assertion of the save signal 214.

Figure 3:
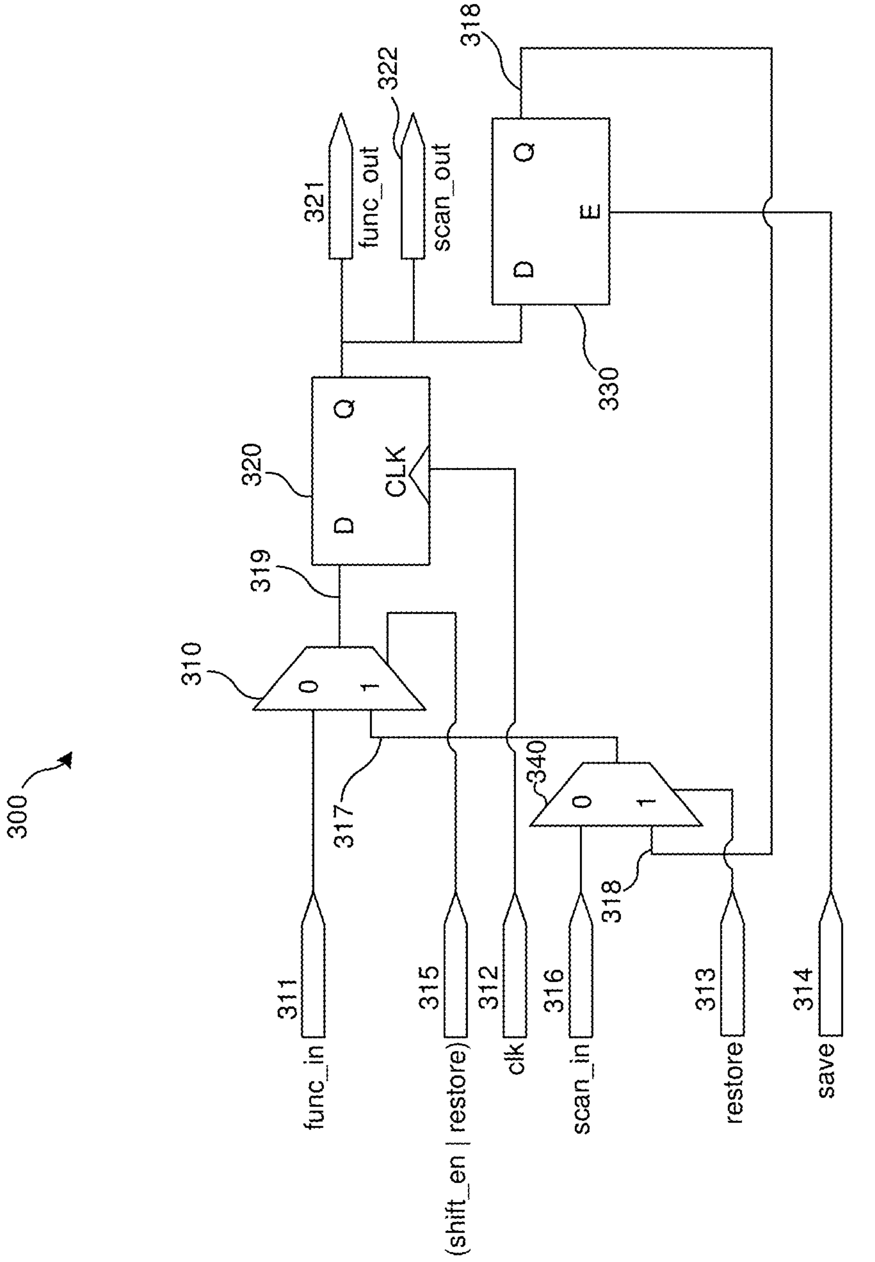
FIG. 3 illustrates an example scannable cell with hold latch.

FIG. 3 illustrates an example scannable cell with hold latch 300. In one example, the scannable cell with hold latch 300 includes a first multiplexer 310, a first D flip flop 320, a second D flip flop 330 and a second multiplexer 340. In one example, the first multiplexer 310 has a first input 311 connected to a function input signal and a second input 317 connected to a second mux output 317 of the second multiplexer 340. In one example, the first multiplexer 310 has a first mux output 319 which is determined by a shift enable_or_restore signal 315. For example, if the shift enable_or_restore signal 315 is at a LOW state, select the first input 311 for the first mux output 319. For example, if the shift enable_or_restore signal 315 is at a HIGH state, select the second input 317 for the first mux output 319.

In one example, the first D flip flop 320 receives the first mux output 319 as its D input. In one example, the first D flip flop 320 is triggered by a clock signal 312 at its CLK input. In one example, the first D flip flop 320 produces a first flip flop output as a function output signal 321 and as a scan output signal 322.

In one example, the second D flip flop 330 receives the first flip output as its D input. In one example, the second D flip flop 330 is triggered by an enable signal which is a save signal 314. In one example, the second D flip flop 330 produces a second flip flop output which is an output state (Q) output signal of the second D flip flop 330. In one example, a first state of the first D flip flop 320 is transferred to a second state of the second D flip flop 330 upon assertion of the save signal 314.

In one example, the second multiplexer 340 has a first input 316 connected to a scan input signal and a second input 318 connected to the output state (Q) output signal of the second D flip flop 330.

In one example, a hold latch may be applied to circuit blocks which do not support data retention. In one example, the hold latch is similar to a retention circuit but without the need for a retention rail to a cell which leads to reduced chip area overhead and lower physical design (PD) effort.

In one example, a combination of the hold latch and multiplexer are used to save and restore a flip flop state, for both scannable and non-scannable flip flops. In one example, the hold latch may be implemented using slow transistors or a custom chip implementation to save chip area.

In one example, the hold latch requires two slow speed signals (e.g., with multi cycle paths (MCPs) such as a save signal and a restore signal. In one example, for a scannable flip flop, a second multiplexer may be used for a restore operation on a scan path to minimize a performance impact.

In one example, the circuit designs shown in FIG. 2 and FIG. 3 are based on a hold latch design from a chip library (i.e., a repository of semiconductor circuit designs). For example, a more compact circuit implementation (i.e., with lower chip area impact) may be attained with custom library cells where save-restore functionality is imbedded in a cell.

Figure 4:
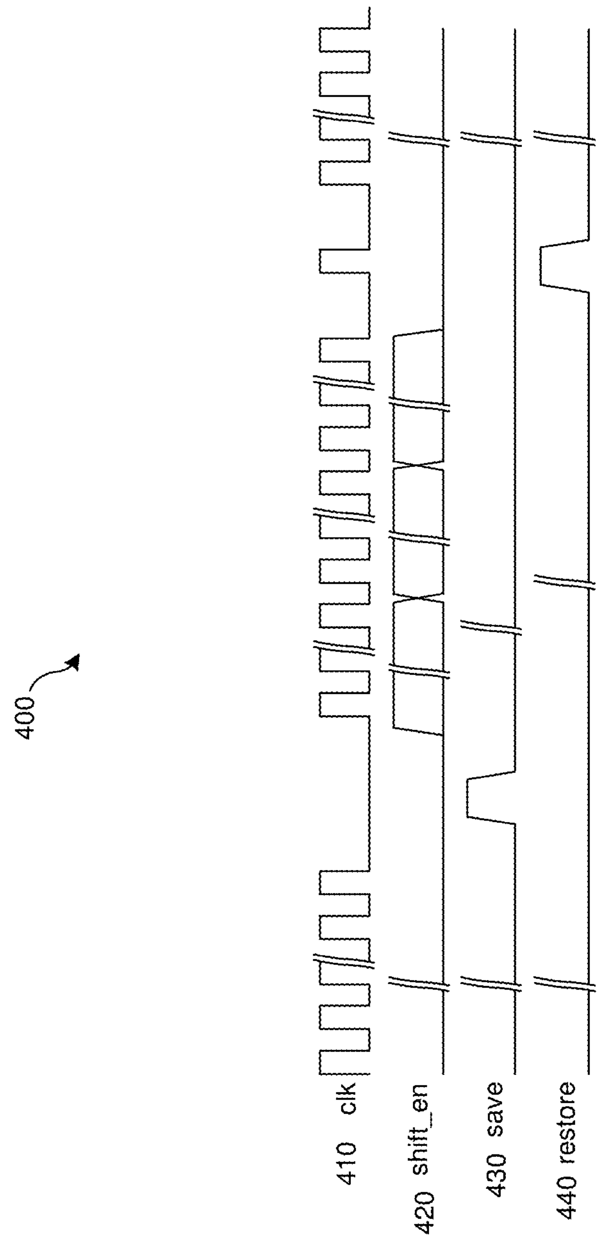
FIG. 4 illustrates an example hold latch timing diagram.

FIG. 4 illustrates an example hold latch timing diagram 400. In one example, the hold latch timing diagram 400 includes a clock signal trace 410, a shift_enable signal trace 420, a save signal trace 430 and a restore signal trace 440.

In one example, during a normal functional state, the save signal trace 430 and the restore signal trace 440 are both at a LOW state. In one example, prior to transitioning to a saving functional state, the clock signal trace 410 is disabled. For example, to save flip flop states, the save signal trace is first asserted to a HIGH state and then deasserted to a LOW state. In one example, subsequent to the saving of flip flop states, scan operations may commence for either a logical built in self test (LBIST) mode or an automatic test pattern generator (ATPG) mode, according to a toggling on the shift_enable signal trace 420. In one example, to restore flip flop states, the clock signal trace 410 disabled a second time and then the restored signal trace 440 is asserted to a HIGH state and then deasserted to a LOW state after one clock cycle in the clock signal trace 410.

Figure 5:
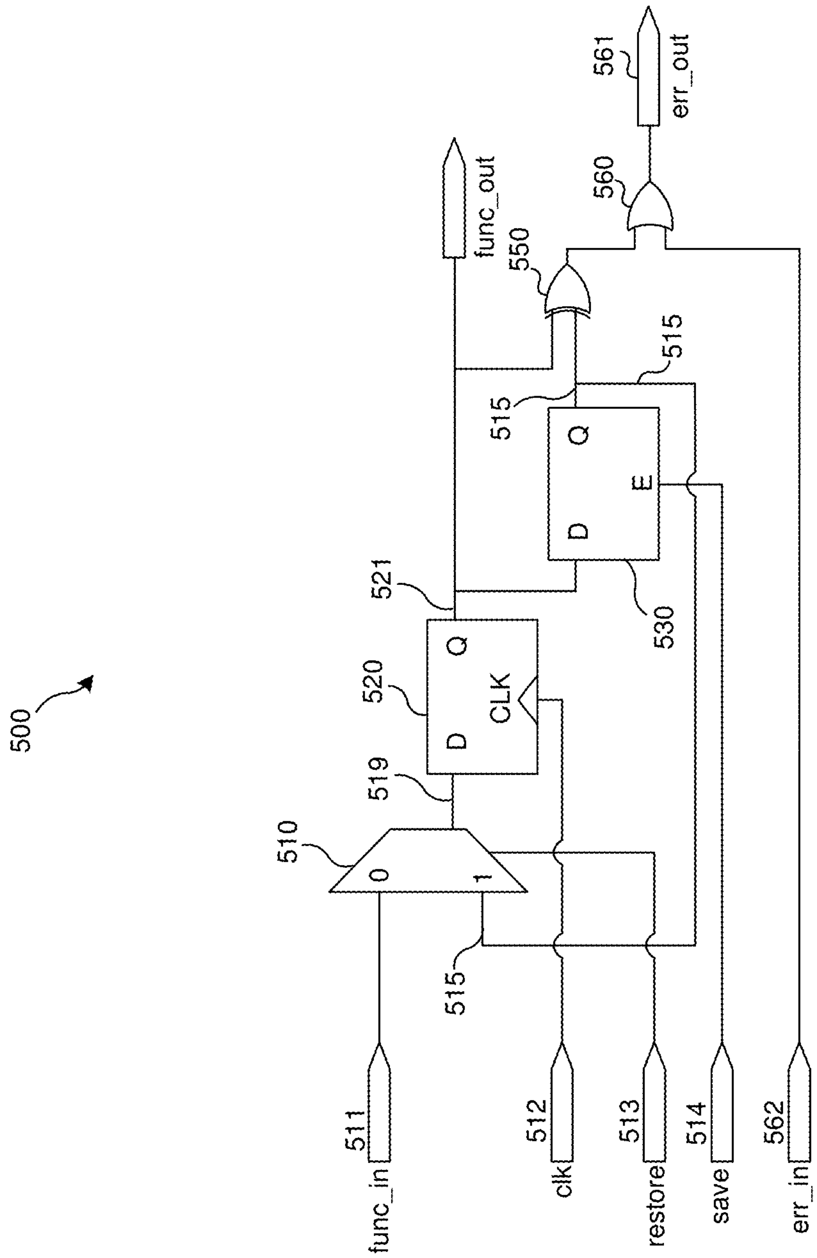
FIG. 5 illustrates a first example hold latch circuit implementation with fault detection.

FIG. 5 illustrates a first example hold latch circuit implementation 500 with fault detection. In one example, the first example hold latch circuit implementation 500 with fault detection includes a multiplexer 510, a first D flip flop 520 and a second D flip flop 530. In one example, the multiplexer 510 has a first input 511 connected to a function input signal and a second input 515 connected to a state (Q) output signal of the second D flip flop 530. In one example, the multiplexer 510 has a multiplexer output 519 which is determined by a restore signal 513. For example, if the restore signal 513 is at a LOW state, select the first input 511 for the multiplexer output 519. For example, if the restore signal 513 is at a HIGH state, select the second input 515 for the multiplexer output 519.

In one example, the first D flip flop 520 receives the multiplexer output 519 as its D input. In one example, the first D flip flop 520 is triggered by a clock signal 512 at its CLK input. In one example, the first D flip flop 520 produces a first flip flop output 521 as a function output signal.

In one example, the second D flip flop 530 receives the first flip flop output 521 as its D input. In one example, the second D flip flop 530 is triggered by an enable signal 514 which is a save signal. In one example, the second D flip flop 530 produces a second flip flop output 515 which is the state (Q) output signal of the second D flip flop 530. In one example, a first state of the first D flip flop 520 is transferred to a second state of the second D flip flop 530 upon assertion of the save signal 514.

In one example, the function output signal 521 and the second flip flop output 515 (connected to the output state (Q) output signal of the second D flip flop 530) may be combined by a logical XOR circuit 550. In one example, an output of the XOR circuit 550 and an input error signal 562 may be combined by a logical OR circuit 560 to produce an output error signal 561.

Figure 6:
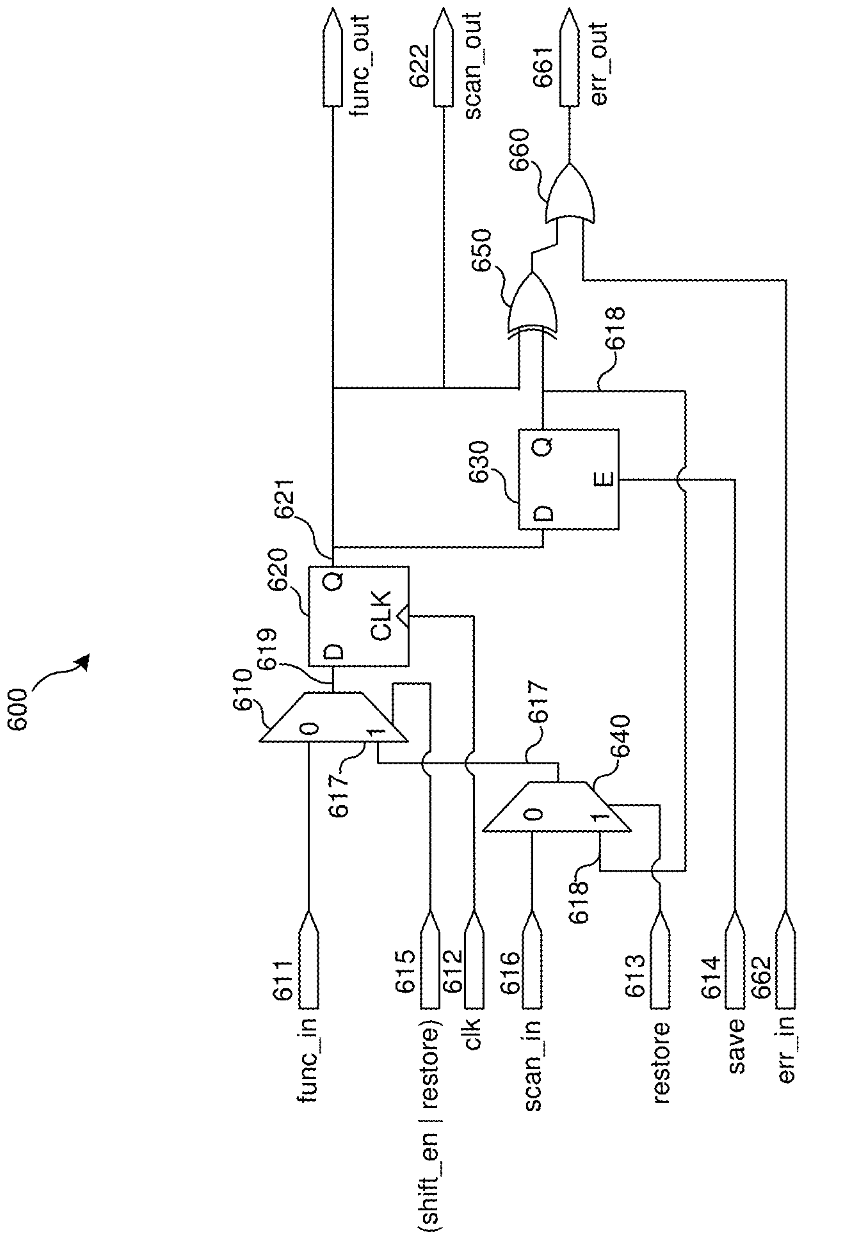
FIG. 6 illustrates a second example hold latch circuit implementation with fault detection.

FIG. 6 illustrates a second example hold latch circuit implementation 600 with fault detection. In one example, the second example hold latch circuit implementation 600 with fault detection includes a first multiplexer 610, a first D flip flop 620, a second D flip flop 630 and a second multiplexer 640. In one example, the first multiplexer 610 has a first input 611 connected to a function input signal and a second input 617 connected to a second mux output 617 of the second multiplexer 640. In one example, the first multiplexer 610 has a first mux output 619 which is determined by a shift enable_or_restore signal 615. For example, if the shift enable_or_restore signal 615 is at a LOW state, select the first input 611 for the first mux output 619. For example, if the shift enable_or_restore signal 615 is at a HIGH state, select the second input 617 for the first mux output 619.

In one example, the first D flip flop 620 receives the first mux output 619 as its D input. In one example, the first D flip flop 620 is triggered by a clock signal 612 at its CLK input. In one example, the first D flip flop 620 produces a first flip flop output as a function output signal 621 and as a scan output signal 622.

In one example, the second D flip flop 630 receives the first flip output as its D input. In one example, the second D flip flop 630 is triggered by an enable signal which is a save signal 614. In one example, the second D flip flop 630 produces a second flip flop output which is an output state (Q) output signal of the second D flip flop 630. In one example, a first state of the first D flip flop 620 is transferred to a second state of the second D flip flop 630 upon assertion of the save signal 614.

In one example, the second multiplexer 640 has a first input 616 connected to a scan input signal and a second input 618 connected to the output state (Q) output signal of the second D flip flop 630. In one example, the second multiplexer 640 has a second mux output 617 (i.e., same as the second input 617) which is determined by a restore signal 613. For example, if the restore signal 613 is at a LOW state, select the first input 616 connected to the scan input signal. For example, if the restore signal 613 is at a HIGH state, select the second input 618 connected to the output state (Q) output signal of the second D flip flop 630.

In one example, to cover faults in save/restore logic, the hold latch may be augmented with additional digital logic to flag an error using an error flag signal if the D flip flop and the hold latch have different state values immediately after a save/restore operation. In one example, to reduce routing overhead, an input error (err_in) signal 662 and an output error (err_out) signal 661 may be daisy chained (i.e., sequentially interconnected) similar to the scan input signal 616 and the scan output signal 622. In one example, the input error signal 662 at a scan chain head may be tied to a zero value. Alternatively, to reduce routing overhead, the input error signal 662 may be multiplexed with the scan input signal 616 and the output error signal 661 may be multiplexed with the scan output signal 622 by using additional digital logic components. In one example, the scan output signal 622 and the second input 618 (connected to the output state (Q) output signal of the second D flip flop 630) may be combined by a logical XOR circuit 650. In one example, an output of the XOR circuit 650 and the input error signal 662 may be combined by a logical OR circuit 660 to produce the output error signal 661.

In one example, the output error signal 661 should be sampled immediately after a save operation or a restore operation; otherwise, the output error signal 661 may be invalid at other times. In one example, a final output error signal at a scan chain tail may be combined with other output error signals in a logical OR operation to provide a single error indication state bit from all scan chains. In one example, a path with the input error signal 662 and the output error signal 661 may be implemented using a multi cycle path (MCP), i.e., a path which requires multiple clock cycles to execute from an input to an output. In one example, sampling digital logic used to sample the output error signal 661 should account for a presence of the MCP.

Figure 7:
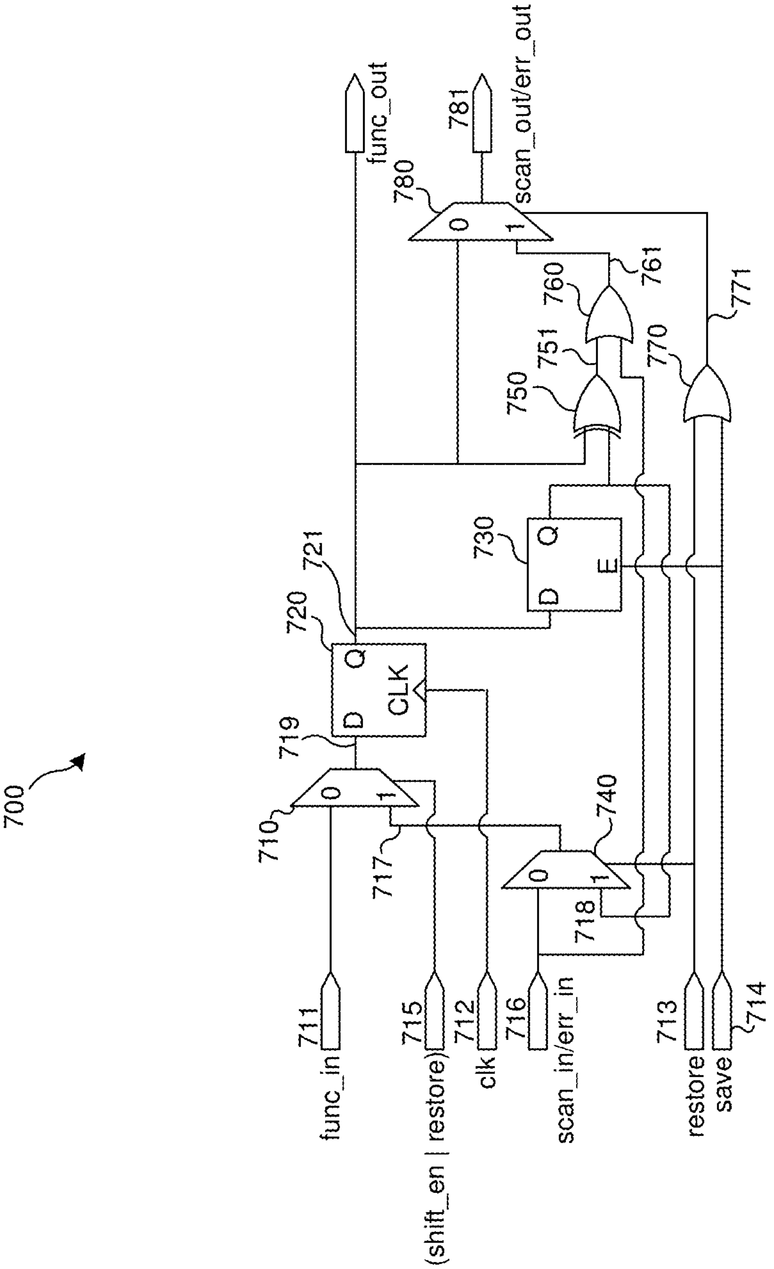
FIG. 7 illustrates a third example hold latch circuit implementation with fault detection.

FIG. 7 illustrates a third example hold latch circuit implementation 700 with fault detection. In one example, the third example hold latch circuit implementation 700 with fault detection includes a first multiplexer 710, a first D flip flop 720, a second D flip flop 730, a second multiplexer 740, a logical XOR circuit 750, first OR circuit 760, a second OR circuit 770 and a third multiplexer 780. In one example, the first multiplexer 710 has a first input 711 connected to a function input signal and a second input 717 connected to a second mux output 717 of the second multiplexer 740. In one example, the first multiplexer 710 has a first mux output 719 which is determined by a shift enable_or_restore signal 715. For example, if the shift enable_or_restore signal 715 is at a LOW state, select the first input 711 for the first mux output 719. For example, if the shift enable_or_restore signal 715 is at a HIGH state, select the second input 717 for the first mux output 719.

In one example, the first D flip flop 720 receives the first mux output 719 as its D input. In one example, the first D flip flop 720 is triggered by a clock signal 712 at its CLK input. In one example, the first D flip flop 720 produces a first flip flop output as a function output signal 721.

In one example, the second D flip flop 730 receives the first flip output 721 as its D input. In one example, the second D flip flop 730 is triggered by an enable signal which is a save signal 714. In one example, the second D flip flop 730 produces a second flip flop output 718 which is an output state (Q) output signal of the second D flip flop 730. In one example, a first state of the first D flip flop 720 is transferred to a second state of the second D flip flop 730 upon assertion of the save signal 714.

In one example, the second multiplexer 740 has a first input 716 connected to a scan_in_or_err_in signal 716 and a second input 718 connected to the second flip flop output (output state (Q) output signal of the second D flip flop 730). In one example, the second mux output 717 of the second multiplexer 740 is selected by a restore signal 713.

In one example, the function output signal 721 and the second flip flop output 718 (connected to the output state (Q) output signal of the second D flip flop 730) may be combined by the logical XOR circuit 750. In one example, an output 751 of the XOR circuit 750 and the scan_in_or_err_in signal 716 may be combined by the first logical OR circuit 760 to produce a first OR output 761. In one example, the restore signal 713 and save signal 714 may be combined by the second logical OR circuit 770 to produce a second OR output 771. In one example, the second OR output 771 may be used to select an output of the third multiplexer 780 with a first input connected to the function output signal 721 and the first OR output 761. In one example, the output of the third multiplexer 780 is a scan_out_or_err_out signal 781.

Figure 8:
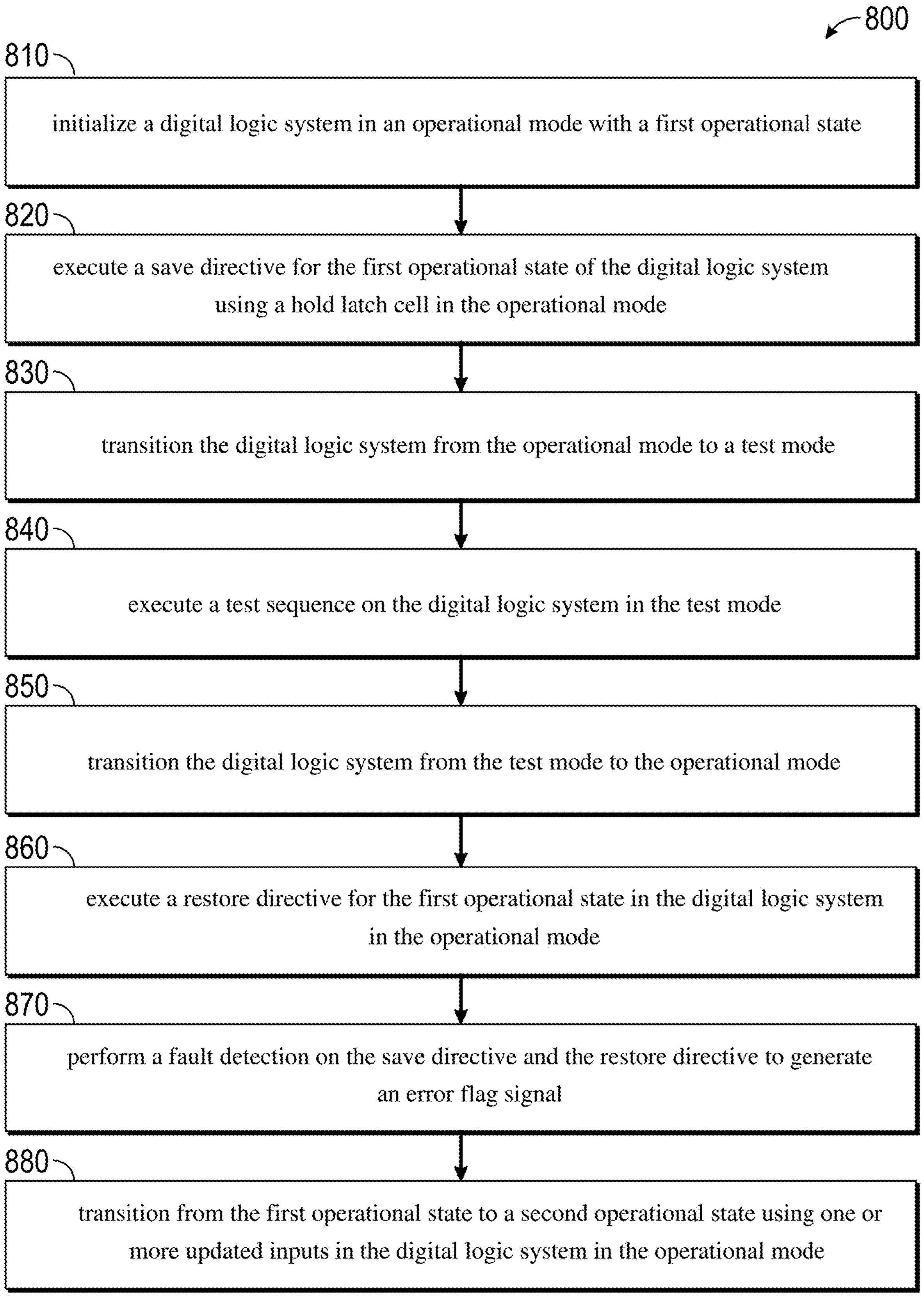
FIG. 8 illustrates an example flow diagram for implementing a test mode save and restore operation.

FIG. 8 illustrates an example flow diagram 800 for implementing a test mode save and restore operation. In block 810, initialize a digital logic system in an operational mode with a first operational state. In one example, a digital logic system is initialized in an operational mode with a first operational state. In one example, the digital logic system is a combinational circuit. In one example, the digital logic system is a sequential circuit. In one example, the first operational state is an initial configuration of state variables of the digital logic system. For example, state variables are combinational circuit output values. In one example, the operational mode is selected by using a control line to select a first multiplexer input state of a first multiplexer. In one example, the first multiplexer input state is a functional input state. In one example, the first multiplexer input state is sent to a first flip flop circuit (e.g., a first D flip flop circuit). In one example, the first multiplexer input state is selected by a controller. In one example, the step of block 810 is performed by a multiplexer.

In block 820, execute a save directive for the first operational state of the digital logic system using a hold latch cell in the operational mode. In one example, a save directive for the first operational state of the digital logic system is executed using a hold latch cell in the operational mode. In one example, the save directive saves the first operational state in the hold latch cell. In one example, the save directive may execute over a multi cycle path (MCP). In one example, the scan directive may execute with a clock signal disabled. In one example, the first operational state is a plurality of internal variables which are sufficient to determine subsequent operational states given subsequent input values. In one example, the save directive utilizes a save signal to trigger a transition in a state output. In one example, the state output is an output state of the hold latch cell. In example, the hold latch cell is implemented using a second flip flop circuit (e.g., second D flip flop circuit). In one example, the hold latch cell is triggered at an enable port. In one example, the step of block 820 is performed by a flip flop circuit.

In block 830, transition the digital logic system from the operational mode to a test mode. In one example, the test mode is selected by using the control line to select a second multiplexer input state. In one example, the digital logic system is transitioned from the operational mode to a test mode. In one example, the second multiplexer input state is a scan input state. In one example, the second multiplexer input state is sent to the first flip flop circuit (e.g., the first D flip flop circuit). In one example, the second multiplexer input state is selected by the controller. In one example, the step of block 830 is performed by a multiplexer.

In block 840, execute a test sequence on the digital logic system in the test mode. In one example, a test sequence is executed on the digital logic system in the test mode. In one example, the test sequence applies a digital pattern sequence to as a scan input signal to obtain a scan response at a scan output signal. In one example, the scan response is compared to a predetermined reference response. In one example, the scan response may be compacted into a digital signature (i.e., a digest). In one example, the test sequence uses a logical built in self test (BIST) sequence or an automatic test pattern generator (ATPG) sequence. In one example, the comparison may be used for fault detection in the digital logic system. In one example, the step of block 840 is performed by a multiplexer.

In block 850, transition the digital logic system from the test mode to the operational mode. In one example, the digital logic system is transitioned from the test mode to the operational mode. In one example, the operational mode is selected by using the control line to select the first multiplexer input state. In one example, the step of block 850 is performed by a multiplexer.

In block 860, execute a restore directive for the first operational state in the digital logic system in the operational mode. In one example, a restore directive for the first operational state is executed in the digital logic system in the operational mode. In one example, the restore directive recovers the first operational state from the hold latch cell. In one example, the restore directive may execute over a multi cycle path (MCP). In one example, the restore directive may execute with a clock signal disabled. In one example, the restore directive utilizes a restore signal to retrieve the first operational state from the hold latch cell. In one example, the step of block 860 is performed by a flip flop circuit.

In block 870, perform a fault detection on the save directive and the restore directive to generate an error flag signal. In one example, a fault detection is performed on the save directive and the restore directive to generate an error flag signal. In one example, the fault detection compares state outputs of the first flip flop circuit and the hold latch cell. In one example, the fault detection uses an XOR circuit on the state outputs of the first flop circuit and the hold scan cell to generate the error flag signal. In one example, the step of block 870 is performed by a logical XOR circuit.

In block 880, transition from the first operational state to a second operational state using one or more updated inputs in the digital logic system in the operational mode. In example, the digital logic system in the operational mode is transitioned from the first operational state to a second operational state using one or more updated inputs. In one example, the second operational state is determined by the first operational state and the updated inputs in the digital logic system. In one example, the step of block 880 is performed by a multiplexer.

In one aspect, one or more of the steps for providing a test mode save and restore operation in FIG. 8 may be executed by one or more processors which may include hardware, software, firmware, etc. The one or more processors, for example, may be used to execute software or firmware needed to perform the steps in the flow diagram of FIG. 8. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

One skilled in the art would understand that various features of different embodiments may be combined or modified and still be within the spirit and scope of the present disclosure.

What is claimed is:

1. An apparatus comprising:

a hold latch cell configured to execute a save directive for a first operational state of a digital logic system and to execute a restore directive for the first operational state in the digital logic system in an operational mode;

a first multiplexer coupled to the hold latch cell, the first multiplexer configured to execute a test sequence on the digital logic system in a test mode; and a logical XOR circuit coupled to the hold latch cell, the logical XOR circuit configured to perform a fault detection on the save directive and the restore directive to generate an error flag signal, wherein the error flag signal uses a multi cycle path (MCP) and is sampled after execution of the save directive and the restore directive.

2. The apparatus of claim 1, further comprising a second multiplexer coupled to the first multiplexer, the second multiplexer configured to initialize the digital logic system in the operational mode with the first operational state.

3. The apparatus of claim 2, further comprising a flip flop circuit coupled to the second multiplexer, the flip flop circuit configured to transition from the first operational state to a second operational state using one or more updated inputs in the digital logic system in the operational mode.

4. The apparatus of claim 3, wherein the save directive and the restore directive are executed over a multi cycle path (MCP).

5. The apparatus of claim 3, wherein the save directive and the restore directive are executed with a clock signal disabled.

6. An apparatus comprising:

means for executing a save directive for a first operational state of a digital logic system using a hold latch cell in an operational mode;

means for executing a test sequence on the digital logic system in a test mode;

means for executing a restore directive for the first operational state in the digital logic system in the operational mode; and means for performing a fault detection on the save directive and the restore directive to generate an error flag signal, wherein the error flag signal uses a multi cycle path (MCP) and is sampled after execution of the save directive and the restore directive.

7. The apparatus of claim 6, further comprising:

means for initializing the digital logic system in the operational mode with the first operational state; and means for transitioning the digital logic system from the operational mode to the test mode.

8. The apparatus of claim 7, further comprising:

means for transitioning the digital logic system from the test mode to the operational mode; and means for transitioning from the first operational state to a second operational state using one or more updated inputs in the digital logic system in the operational mode.

9. A method comprising:

executing a save directive for a first operational state of a digital logic system using a hold latch cell in an operational mode;

executing a test sequence on the digital logic system in a test mode;

executing a restore directive for the first operational state in the digital logic system in the operational mode; and performing a fault detection on the save directive and the restore directive to generate an error flag signal, wherein the error flag signal uses a multi cycle path (MCP) and is sampled after execution of the save directive and the restore directive.

10. The method of claim 9, wherein the save directive saves the first operational state in a hold latch cell.

11. The method of claim 10, wherein the save directive utilizes a save signal to trigger a transition in a state output.

12. The method of claim 11, wherein the state output is an output state of the hold latch cell.

13. The method of claim 9, wherein the executing the restore directive is performed over a multi cycle path (MCP).

14. The method of claim 13, wherein the executing the restore directive is performed with a clock signal disabled.

15. The method of claim 9, wherein the executing the save directive is performed over a multi cycle path (MCP).

16. The method of claim 15, wherein the executing the save directive is performed with a clock signal disabled.

17. The method of claim 9, further comprising initializing the digital logic system in the operational mode with the first operational state.

18. The method of claim 17, further comprising transitioning the digital logic system from the operational mode to the test mode.

19. The method of claim 18, further comprising transitioning the digital logic system from the test mode to the operational mode.

20. The method of claim 19, further comprising transitioning from the first operational state to a second operational state using one or more updated inputs in the digital logic system in the operational mode.

* * * * *